United States Patent
Motoshiromizu et al.

(10) Patent No.: US 7,432,712 B2
(45) Date of Patent: Oct. 7, 2008

(54) MAGNETIC RESONANCE IMAGING APPARATUS

(75) Inventors: Hirofumi Motoshiromizu, Ibaraki (JP); Kunihito Suzuki, Ibaraki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/676,717

(22) Filed: Feb. 20, 2007

(65) Prior Publication Data

US 2007/0210795 A1    Sep. 13, 2007

(30) Foreign Application Priority Data

Feb. 24, 2006    (JP)    ............................... 2006-047645

(51) Int. Cl.
    *G01V 3/00*    (2006.01)
(52) U.S. Cl. ...................... 324/318; 324/322
(58) Field of Classification Search ......... 324/300–322; 600/407–445
    See application file for complete search history.

(56) References Cited

U.S. PATENT DOCUMENTS

| | | | |
|---|---|---|---|
| 4,672,346 A * | 6/1987 | Miyamoto et al. ........... | 335/296 |
| 5,003,276 A * | 3/1991 | Sarwinski et al. ........... | 335/304 |
| 5,237,300 A * | 8/1993 | Ige et al. ...................... | 335/299 |
| 5,410,287 A * | 4/1995 | Laskaris et al. .............. | 335/216 |
| 5,548,653 A * | 8/1996 | Pla et al. ...................... | 381/71.2 |
| 6,556,012 B2 * | 4/2003 | Yamashita ................... | 324/318 |
| 7,276,908 B2 * | 10/2007 | Suzuki et al. ................ | 324/318 |
| 2002/0188192 A1* | 12/2002 | Udo et al. .................... | 600/410 |
| 2005/0283964 A1* | 12/2005 | Mao et al. ...................... | 29/458 |

FOREIGN PATENT DOCUMENTS

| | | |
|---|---|---|
| JP | 2004-267397 | 9/2004 |
| JP | 2005-137530 | 6/2005 |

* cited by examiner

*Primary Examiner*—Brij B Shrivastav
(74) *Attorney, Agent, or Firm*—Mattingly, Stanger, Malur & Brundidge, PC

(57) ABSTRACT

The present invention relates to a magnetic resonance imaging apparatus, which includes a apparatus bottom surface, a static magnetic field generator, two pieces of which are placed opposite each other vertically across an image pickup space, and a plurality of support legs for supporting a weight of the resonance imaging apparatus, the support legs being elastically deformed in a direction in which the weight is to be applied, and being arranged between the apparatus bottom surface and a floor. Furthermore, each of the support legs has a spring constant which is set to absorb a displacement between the apparatus bottom surface and the floor, while bearing the weight. This MRI apparatus has the simple structure enabling the efficient damping of the vibrations which may cause the deterioration of magnetic resonance images.

7 Claims, 10 Drawing Sheets

MAGNETIC RESONANCE IMAGING APPARATUS

CROSS-REFERENCE TO RELATED APPLICATIONS

This application claims the benefit of Japanese Patent Application 2006-047645 filed on Feb. 24, 2006, the disclosure of which is incorporated herein by reference.

BACKGROUND OF THE INVENTION

1. Field of the Invention

Generally, the present invention relates to magnetic resonance imaging apparatuses. More specifically, the present invention relates to a technique for damping vibrations of a static magnetic field generator in MRI apparatuses.

2. Description of the Related Art

A typical magnetic resonance imaging apparatus (hereinafter, called "MRI apparatus") is equipped with a static magnetic field generator. This static magnetic field generator emits a uniform static magnetic field to a test subject, so that he or she is exposed to the static magnetic field. Simultaneously, the MRI apparatus irradiates the test subject with an electromagnetic wave. In response to this, the apparatus detects a magnetic resonance signal emitted from the test subject, and the signal then undergoes an image process. Consequently, the apparatus produces magnetic resonance images which exhibit the physical property of the test subject.

Furthermore, a typical MRI apparatus is provided with a gradient magnetic field generator, which emits a gradient magnetic field. The gradient magnetic field is superimposed on the static magnetic field, so that the magnetic resonance signal is pinpointed.

Such MRI apparatuses have two types: one is a horizontal static magnetic field type and the other is a vertical static magnetic field type.

A horizontal static magnetic field type has a cylindrical static magnetic field generator. A test subject is set into this generator, while the axis of his or her body is aligned with the orientation of the static magnetic field.

A vertical static magnetic field type has a static magnetic field generator, two pieces of which are placed opposite each other vertically. A test subject is set between the pieces. Therefore, the axis of his or her body is perpendicular to the orientation of the static magnetic field.

The vertical static magnetic field type is superior to the horizontal type, in that a test subject does not feel stuffy in the generator and an inspector can access the interior of the generator easily.

The quality of magnetic resonance images is influenced by the intensities of the static magnetic field and the gradient magnetic field. As the magnetic fields are stronger, the quality of the images is enhanced. The static magnetic field generator is made of permanent, resistive or superconducting magnets. Especially when the strong static magnetic field, such as more than 0.4 tesla, is necessary, a static magnetic field generator made of a superconducting magnet is typically used.

The quality of magnetic resonance images also depends on the uniformity of the static magnetic field. As the uniformity is better, the quality of the images is enhanced. The uniformity of the static magnetic field lowers, when the static magnetic field generator vibrates. Thus, the quality of magnetic resonance images is affected by the vibration of the static magnetic field generator. In order to provide a sufficient level of image quality, the uniformity of the static magnetic field needs to be on the order of 100 ppm. For an MRI apparatus of a few meters in height, an allowed vibration level is on the order of several micrometers. Thus, an allowed vibration level is up to one per million of the height of an apparatus.

As described above, such an MRI apparatus produces images of a test subject, while irradiating him or her with an electromagnetic wave by using high-frequency coils. Furthermore, the apparatus feeds a current to its gradient magnetic field generator in sync with the irradiation of the electromagnetic wave, thereby emitting a gradient magnetic field. As a result, a current flows within the static magnetic field. This results in the generation of the Lorentz force, which vibrates the gradient magnetic field generator. In conjunction of this vibration, the static magnetic field generator also vibrates.

Furthermore, as the static magnetic field or gradient magnetic field is stronger, a static magnetic field generator vibrates more powerfully. If one or both of the static magnetic field and gradient magnetic field is strong for the purpose of providing high image quality, the vibrating force produced by the gradient magnetic field generator increases. Consequently, the static magnetic field generator vibrates more powerfully.

Such a vibration may become an important concern for vertical static magnetic field type of MRI apparatuses. A vertical static magnetic field type of MRI apparatus has a structure where the two pieces of a static magnetic field generator are coupled to each other, with being placed opposite one another vertically. This structure is difficult to have a sufficient structural strength, because it is required to take full advantage of the merit that enables a test subject not to feel stuffy or an inspector to access the interior of the apparatus easily. Moreover, the center of gravity of the apparatus is prone to be high. Therefore, the apparatus is more likely to vibrate. As a result, a technique for damping the vibrations becomes important.

A technique for damping vibrations of MRI apparatuses is disclosed by Japanese Unexamined Patent Application Publication 2005-137530 (see page 9 and FIG. 1). A disclosed MRI apparatus is a typical vertical static magnetic field type of static magnetic field generator made of superconducting magnets. Specifically, this MRI apparatus has a structure where a static magnetic field generator is made of superconductive coils with being placed opposite each other vertically across an image pickup space. In addition, each superconductive coil is contained in a cooling container, which is housed in a vacuum container. The cooling containers are coupled through a cooling container connection pipe, thereby constituting a cooling container module (inner chamber system). The vacuum containers are coupled through a vacuum container connection pipe, thereby constituting a vacuum container module (outer chamber system). Moreover, the gradient magnetic field coils, which apply a gradient magnetic field to be superimposed in a static magnetic field, are placed opposite each other across the image pickup space. These coils are supported by the vacuum containers, respectively.

As described above, in such MRI apparatuses, the electromagnetic wave generated upon the production of images involves the vibration of the gradient magnetic field coils. As a result, the vacuum containers supporting the gradient magnetic field coils, that is, the vacuum container module also vibrates. This vibration is considered to be a vibration of a first bending mode, because the lower surface of the lower vacuum container is restricted by a floor. Accordingly, the vibration of the lower vacuum container is weaker than that of the upper vacuum container. The MRI apparatus of JP2005-137530 takes advantage of this property in order to decrease the vibration of the cooling containers or superconductive coils, which is caused by the vibration of the gradient magnetic field coils. To demonstrate, multiple support members are arranged between the lower cooling container and the lower vacuum container. In addition, the cooling container module is supported by the lower vacuum container through the supporting members. Thus, the lower vacuum container that vibrates slightly is configured to support the cooling container module. With this structure, the vibration of the cooling containers, that is, of the superconductive coils can be damped.

It is assumed that a floor where an MRI apparatus is installed vibrates by itself. In this case, the MRI apparatus vibrates due to the vibration transferred from the floor (external vibration), as well as by the self-vibration of the apparatus. In order to prevent the external vibration, the technique disclosed by Japanese Unexamined Patent Application Publication 2004-267397 has been conceived (see page 14 and FIG. 1). The disclosed MRI apparatus is equipped with a supporting mechanism that supports a magnet for generating a static magnetic field on a floor. This supporting mechanism is composed of a position adjustment unit and a damping unit. The position adjustment unit is adapted to adjust the position of the magnets. The damping unit is adapted to damp the vibration of the floor by changing the frequency of the vibration transferred from the floor into a frequency other than a resonance frequency of the magnets. This MRI apparatus can damp the external vibration efficiently. Thus, it is possible to prevent the deterioration of magnetic resonance images, even if any vibration source is present on a floor.

Now, a description will be given, of the types of vibrations. Among vibrations caused due to the inner structure of the MRI apparatus, the following vibrations are considered to affect images:

1) a vibration of a first bending mode, that is, a vibration caused by an apparatus of which lower surface is restricted by a floor;

2) a rocking vibration, that is, a vibration caused by an apparatus of which apparatus bottom surface is free, for example, is supported by a spring, etc; and 3) a vibration of lower surface of an apparatus.

The rocking vibration means continuous rocking of the apparatus due to the vibration of the gradient magnetic field coils. The apparatus seems to rotate taking a floor as a fulcrum. Specifically, it is considered that an apparatus is placed directly on a floor while being in contact with the floor. In this case, if the floor is not flat, then the lower surface of the apparatus may be in point contact with the floor. Thus, the installed apparatus is unstable. Then, the apparatus rocks, as if it rotated taking the contact point as a fulcrum. This vibration is called the "rocking vibration". The rocking vibration can be ignored on the condition that the static magnetic field is not strong. However, when the intensity of the static magnetic field is 1 tesla or more, the rocking vibration may affect images.

Next, the vibration of lower surface of an apparatus will be described. It is assumed that an apparatus is placed on a floor with being partially supported. In this case, a vibration of a bending mode may occur on portions that are off from the floor. This vibration is called the "the vibration of lower surface of an apparatus". This vibration may affect images, when the intensity of the static magnetic field exceeds a predetermined level, similar to the rocking vibration.

In order to damp the vibration of MRI apparatuses, JP2005-137530 discloses the mechanism for efficiently damping the vibration of superconductive coils (or a static magnetic field generator) due to the vibration of the first bending mode. This mechanism can be effective to damp the vibration to the extent that images are not deteriorated. This technique adapts a structure where supporting members are arranged between a lower cooling container and a lower vacuum container. Due to those members, the vibration transferring from the vacuum container module to the cooling container module is attenuated. As a result, the vibration of the cooler container and the superconductive coils is damped. However, this structure does not damp the rocking vibration sufficiently. Hence, any other structures are necessary, if the rocking vibration needs to be damped efficiently.

The rocking vibration can occur when the installed apparatus is unstable, as described above. Accordingly, in order to damp the rocking vibration efficiently, the installed apparatus needs to be stable. To attain this object, an adjustment structure for partially supporting an apparatus, such as the support mechanism disclosed by JP2004-267397, is effective. In addition to this structure, an anchor structure for supporting the apparatus by using an anchor is also effective.

However, the above adjustment structure and the anchor structure may cause the cost increase. Furthermore, the working hours for installing an apparatus with the above structure may be prolonged. In addition, the adjustment structure needs an enlarged installation space in the vertical direction. In consideration of the above disadvantages, another structure by which an apparatus can be installed easily and stably is required.

Moreover, the above adjustment structure and the anchor structure may not be sufficient to damp the vibration of the lower surface. The vibration of lower surface of an apparatus can be damped by supporting portions of the lower surface where the loops of the vibration appear. However, the above adjustment structure and anchor structure can support only the surrounding portions of the lower surface. Thus, they fail to damp the vibration of the lower surface efficiently.

Taking the above disadvantages into account, the present invention has been conceived. An object of the present invention is to provide a simple MRI apparatus which can be kept stably installed. An additional object of the present invention is to present an MRI apparatus which is configured to damp the rocking vibration and the vibration of its lower surface efficiently.

SUMMARY OF THE INVENTION

According to a first aspect of the present invention, there is provided, a magnetic resonance imaging apparatus including:

a1) a apparatus bottom surface;

a2) a static magnetic field generator, two pieces of which are placed opposite each other vertically across an image pickup space; and a3) a plurality of support legs for supporting a weight of the magnetic resonance imaging apparatus, the support legs being elastically deformed in a direction in which the weight is to be applied, and being arranged between the apparatus bottom surface and a floor.

Accordingly to a second aspect of the present invention, there is provided, in the magnetic resonance imaging apparatus, each of the support legs has a spring constant which is set to absorb displacement between the apparatus bottom surface and the floor, while bearing the weight.

According to a third aspect of the present invention, there is provided, in the magnetic resonance imaging apparatus, each of the support legs includes a stack of a first member and a second member, and the first and second members have different spring constants.

According to a fourth aspect of the present invention, there is provided, in the magnetic resonance imaging apparatus, the support legs include more than three support legs.

According to a fifth aspect of the present invention, there is provided, the magnetic resonance imaging apparatus further including a support mechanism for supporting the static magnetic field generator, the support mechanism having different strengths in first and second horizontal directions perpendicular to each other, wherein a strength of the first horizontal direction is higher than that of the second horizontal direction. In addition, each of four of the support legs is placed at a 25° to 45° angle with respect to the first horizontal direction.

According to a sixth aspect of the present invention, there is provided, the magnetic resonance imaging apparatus further including:

b1) a plurality of superconductive coils constituting the static magnetic field generator;
b2) a cooling container module including a plurality of cooling containers for containing the superconductive coils, respectively;
b3) a vacuum container module including a plurality of vacuum containers for containing the cooling containers, respectively;
b4) the cooling container module being erected on a bottom of the vacuum container module; and
b5) a plurality of support members for supporting the cooling container module.

According to a seventh aspect of the present invention, there is provided, the magnetic resonance imaging apparatus further including a support mechanism for supporting the static magnetic field generator, the support mechanism having different strengths in first and second horizontal directions perpendicular to each other, wherein a strength of the first horizontal direction is higher than that of the second horizontal direction.

In addition, the support members include four support members, and each of the support members is placed at a 25° to 45° angle with respect to the first horizontal direction.

According to an eighth aspect of the present invention, there is provided, in the magnetic resonance imaging apparatus, the four support members are aligned with four of the support legs, respectively.

In the MRI apparatus of the present invention, the support legs are arranged between the apparatus bottom surface and the floor. In addition, the support legs have a predetermined spring constant that is set to be elastically deformed in a direction in which a load is applied. If the apparatus is installed on the floor through the support legs, then the support legs are elastically deformed due to the weight of the apparatus. Thanks to this deformation, the MRI apparatus is supported by the support legs with a substantially uniform force. This makes it possible to enhance the stability of the installed apparatus, thereby damping the rocking vibration of the apparatus efficiently.

Moreover, the support legs can be placed not only on the circumference of the apparatus bottom surface but also on the interior thereof, easily. Therefore, by placing the support legs on the interior of the apparatus bottom surface as necessary, the vibration of the apparatus can be damped efficiently. In addition, a process of placing the support legs on predetermined positions is relatively easy.

In conclusion, with an MRI apparatus of the present invention, it is possible to damp the vibration of the static magnetic field generator which may cause the deterioration of magnetic resonance images. Accordingly, even if the static magnetic field is strong such as more than 1 tesla, the MRI apparatus of the present invention has an ability to provide a high level of images. Furthermore, the MRI apparatus can be assembled at low costs and by an easy process.

Other aspects, features and advantages of the present invention will become apparent upon reading the following specification and claims when taken in conjunction with the accompanying drawings.

BRIEF DESCRIPTION OF THE DRAWINGS

For more complete understanding of the present invention and the advantages hereof, reference is now made to the following description taken in conjunction with the accompanying drawings wherein.

DETAILED DESCRIPTION OF THE
EXEMPLARY EMBODIMENTS OF THE
INVENTION

Figure 1:
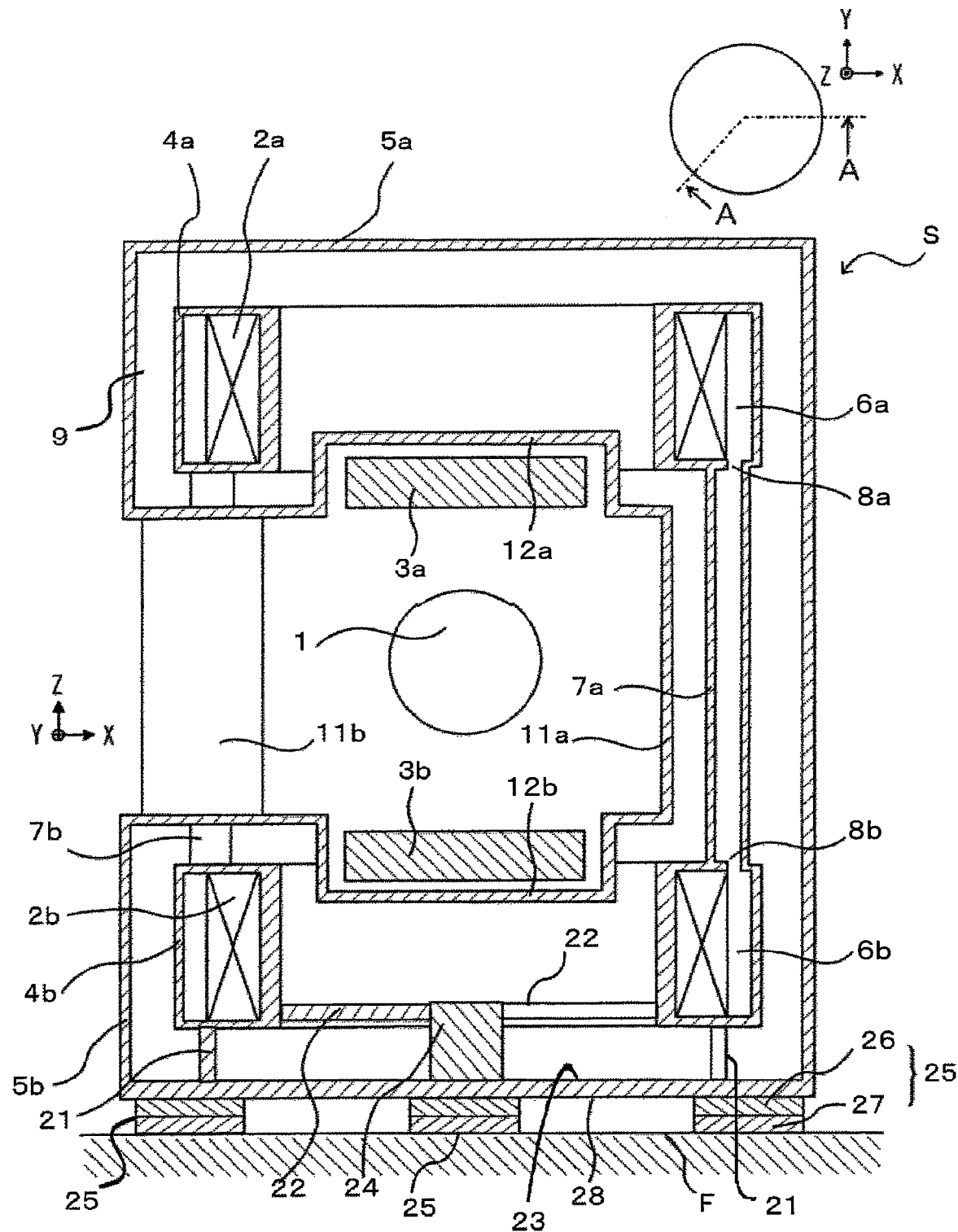
FIG. 1 is a vertical cross-section view depicting an inner structure of an MRI apparatus according to a first embodiment of the present invention.
Figure 2:
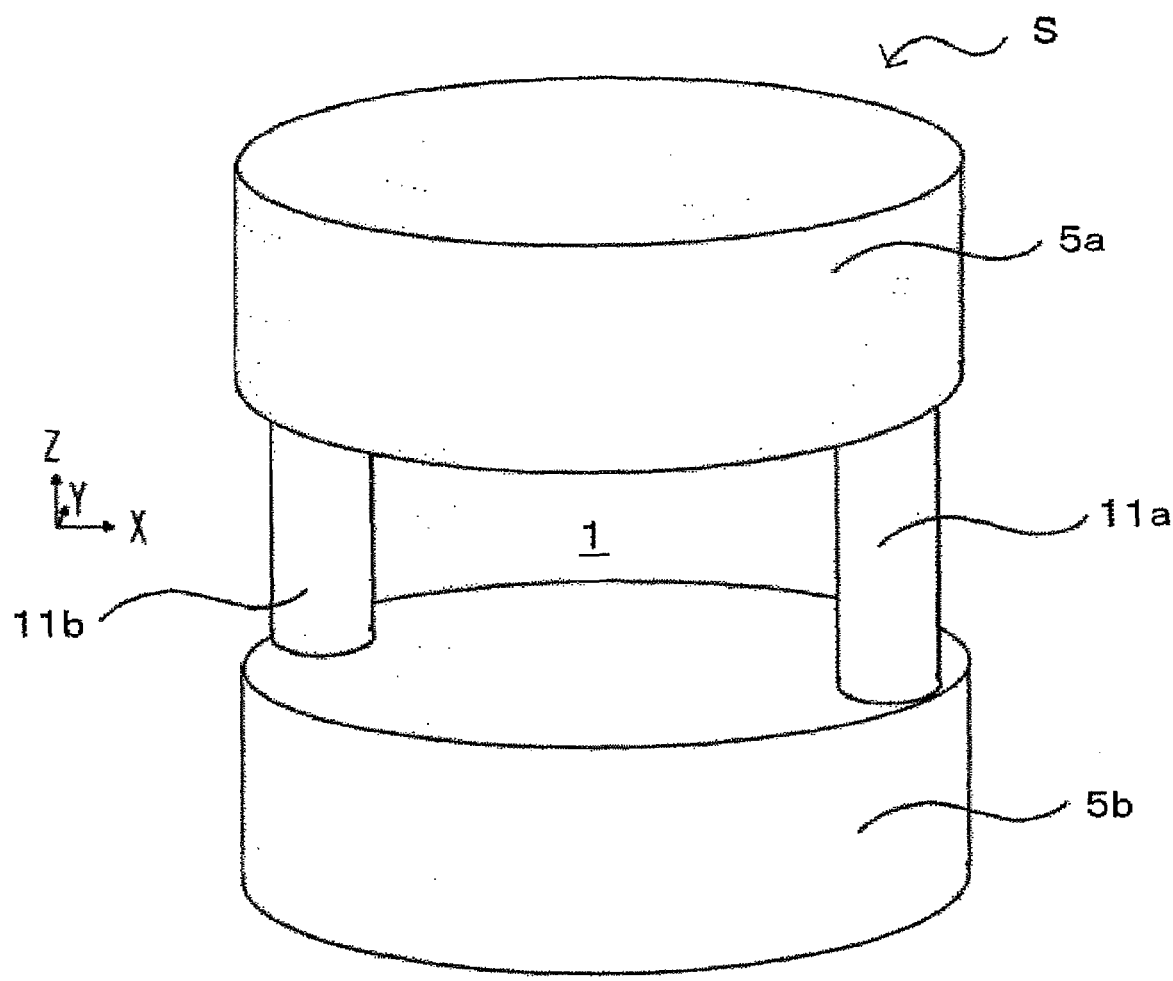
FIG. 2 is a perspective view depicting an appearance of the MRI apparatus according to the first embodiment.

Referring to FIGS. 1 and 2, an MRI apparatus S according to a first embodiment of the present invention is constituted as follows:

1) a static magnetic field generator composed of upper and lower superconductive coils $2a$ and $2b$ that are placed opposite each other across an image pickup space 1 vertically; and
2) a gradient magnetic field generator composed of upper and lower gradient magnetic field coils $3a$ and $3b$ that are placed opposite each other across the image pickup space 1 vertically.

Each superconductive coil is formed by winding a coil in a ring form, and it is adapted to apply a uniform static magnetic field in the image pickup space 1. The superconductive coils 2a and 2b are contained in upper and lower cooling containers 4a and 4b, which are housed in vacuum containers 5a and 5b, respectively.

Each cooling container has a ring and hollow shape for containing the superconductive coil. Furthermore, the upper cooling container 4a and the lower cooling container 4b are arranged vertically, which correspond to the upper superconductive coil 2a and the lower superconductive coil 2b. Storage spaces 6a and 6b contain a coolant such as liquid helium, so that the temperature of the superconductive coils 2a and 2b is maintained at ultracold temperature such as 2 K, which is required to keep the superconductive property of the upper superconductive coils. The cooling containers 4a and 4b are coupled by cooling container connection pipes 7a and 7b that are both arranged across the image pickup space 1, thereby constituting a cooling container module (inner chamber system). In this cooling container module, the cooling containers 4a and 4b are thermally coupled to each other through the inner space of the cooling container connection pipes 7a and 7b. Specifically, the cooling containers 4a and 4b have connection holes 8a and 8b through which the cooling containers 4a and 4b are coupled to the cooling container connection pipe 7a, respectively. By the connection holes 8a and 8b and the interior of the cooling container connection pipe 7a, the cooling containers 4a and 4b are coupled to each other.

The vacuum containers 5a and 5b have a hollow and circular shape, and have a reception space 9 where the cooling container 4a and 4b are placed. In addition, the upper and lower vacuum containers 5a and 5b correspond to the upper and lower cooling containers 4a and 4b, respectively. The reception space 9 is in vacuum to thereby thermally isolate the cooling containers 4a and 4b from the surroundings. The vacuum containers 5a and 5b are coupled to each other through vacuum container connection pipes 11a and 11b, thereby constituting a vacuum container module (outer chamber system). The vacuum container connection pipes 11a and 11b are arranged corresponding to the cooling container connection pipes 7a and 7b, respectively, and they are placed opposite each other across the image pickup space 1 laterally. contain the cooling container connection pipes 7a and 7b, respectively. This means that the vacuum container module entirely covers the cooling container module. In the vacuum container module, the degree of the vacuum in the reception space 9 is kept uniform through the interior of the vacuum container connection pipes 11a and 11b. The lower vacuum container 5b houses the lower cooling container 4b in such a way the lower cooling container 4b is isolated thermally. In this way, the vacuum container module supports the cooling container module. This detailed description will be given later.

Although being not illustrated, a radiation shield plate is provided between the vacuum container module and the cooling container module. This plate attenuates thermal radiation from the vacuum container module to the cooling container module. To demonstrate, the radiation shield plate covers the cooling containers 4a and 4b, and the cooling container connection pipes 7a and 7b. Typically, the radiation shield plate is cooled by a refrigerating machine (not shown) for cooling the coolant of the cooling container 4.

The gradient magnetic field coils 3a and 3b have a disc form, and both are supported by the vacuum containers 5a and 5b, respectively. Specifically, recesses 12a and 12b are formed on surfaces of the vacuum containers 5a and 5b where the image pickup space is positioned, respectively. Further, the gradient magnetic field coils 3a and 3b are set within the recesses 12a and 12b, respectively. In addition, each gradient magnetic field coil may be fixed with one or more stud bolts or rubber cushions. The gradient magnetic field coils 3a and 3b apply a gradient magnetic field to be superimposed in a static magnetic field from the superconductive coils 2a and 2b. Thanks to this gradient magnetic field, positional information on a magnetic resonance signal can be obtained to thereby produce magnetic resonance images.

The MRI apparatus S further include the following components in addition to the above-described components.

1) a high frequency coil which emits an electromagnetic wave to a test subject (not shown) on the image pickup space 1 in order to excite a magnetic resonance;
2) a receiving coil which receives a magnetic resonance signal emitted from the test subject;
3) a table device on which the test subject lies and which guides him or her to the image pickup space 1;
4) a power supply device which supplies power to the superconductive coils 2a and 2b and the gradient magnetic field coils 3a and 3b;
5) a controller which takes control of the MRI apparatus S; and
6) an image reformation device which produces image resonance images, based on the magnetic resonance signal.

Since the above components 1) to 6) are known devices in this art, their illustration and description are omitted.

Next, a description will be given below, of a mechanism by which the vacuum container module supports the cooling container module and of a structure of the installed MRI apparatus S. The mechanism and structure will be described by using virtual coordinates within the MRI apparatus S. The MRI apparatus S has an anisotropic structure, which means that the two vacuum container connection pipes 11a and 11b are aligned in only one direction. Accordingly, the structure of the apparatus S in a first direction where the pipes 11a and 11b are aligned is stronger than that in a second direction perpendicular to the first direction. The first direction is called a "strong structure direction", and the second direction is called a "weak structure direction". The coordinates of the MRI apparatus S are represented by X, Y and Z, and its origin is located at the center of gravity of the MRI apparatus S (typically, the center of the apparatus). An X axis is provided in the strong structure direction, and a Y axis is provided in the weak structure direction. In addition, a Z axis is provided in the vertical direction.

A structure for supporting the cooling container module will be described. The cooling container module is supported by the vacuum container module, as described above. To demonstrate, the lower cooling container 4b is supported by the lower vacuum container 5b through multiple vertical support members 21 and lateral support members 22. It is preferable that the support members 21 and 22 are made of a non-magnetic material having a small thermal conductivity. The reason why the support member is preferably a non-magnetic material is to prevent an influence on the static magnetic field and the gradient magnetic field. Furthermore, the reason why the support member is preferably a material having a small thermal conductivity is to increase a thermal resistance between the vacuum container 5b and the cooling container 4b. An example of the material is fiber reinforced plastic. Therefore, the support members 21 and 22 of FIG. 1 are made of fiber reinforced plastic. In addition, the members may have a shape for enhancing a thermal resistance between the vacuum container 5b and the cooling container 4b. For example, each support member may form a pipe shape made of fiber reinforced plastic or a curved shape for increasing the thermal transfer distance.

Figure 3A:
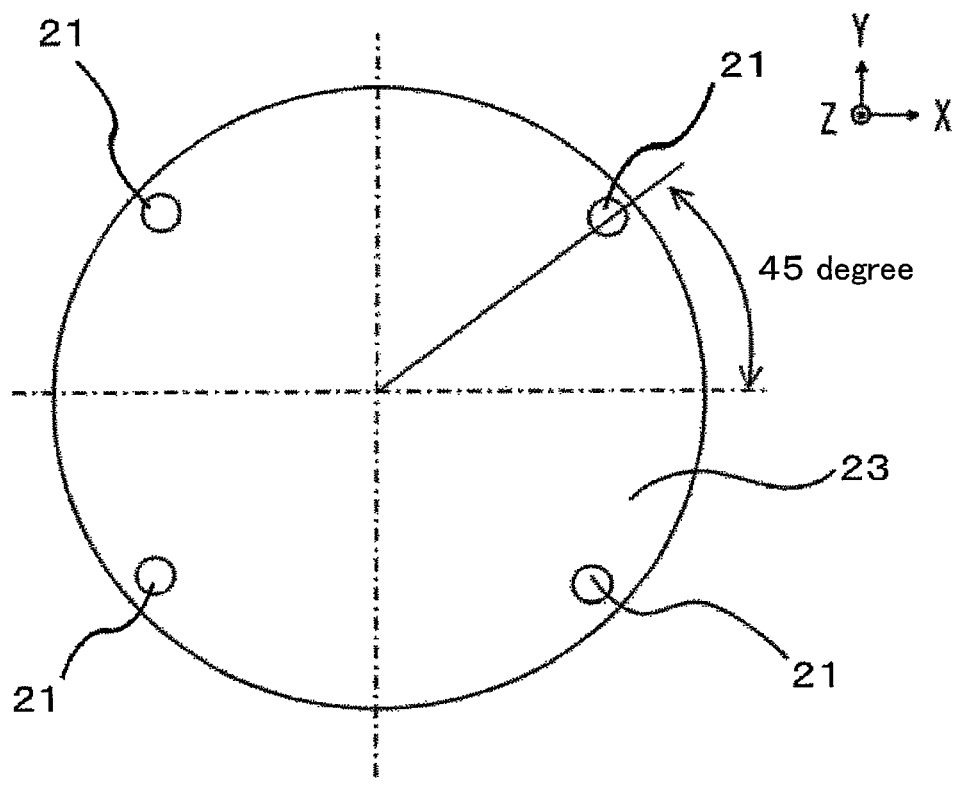
FIG. 3A is a view depicting an arrangement of vertical support members in the apparatus according to the first embodiment.

The vertical support member 21 is erected on a bottom plate 23 of the lower vacuum container 5b, and supports the lower cooling container 4b vertically from the bottom plate 23. The vertical support members 21 are placed at predetermined locations, and apart from one another. In this embodiment, the four vertical support members 21 are arranged close to the circumference of the lower vacuum container 5b and at a 45° angle with respect to the X axis, as shown in FIG. 3A.

With the above support structure, the following vibration occurring on the superconductive coil 2 can be efficiently damped:
1) the vibration of the first bending mode which is likely to occur in an apparatus of which lower surface is restricted by a floor: and
2) the rocking vibration: and
3) a rocking-like vibration.

Note that the vibration of the first bending mode is typically caused by the vibration of the gradient magnetic field coils 3a and 3b due to the electromagnetic wave emitted upon production of images.

Figure 4A:
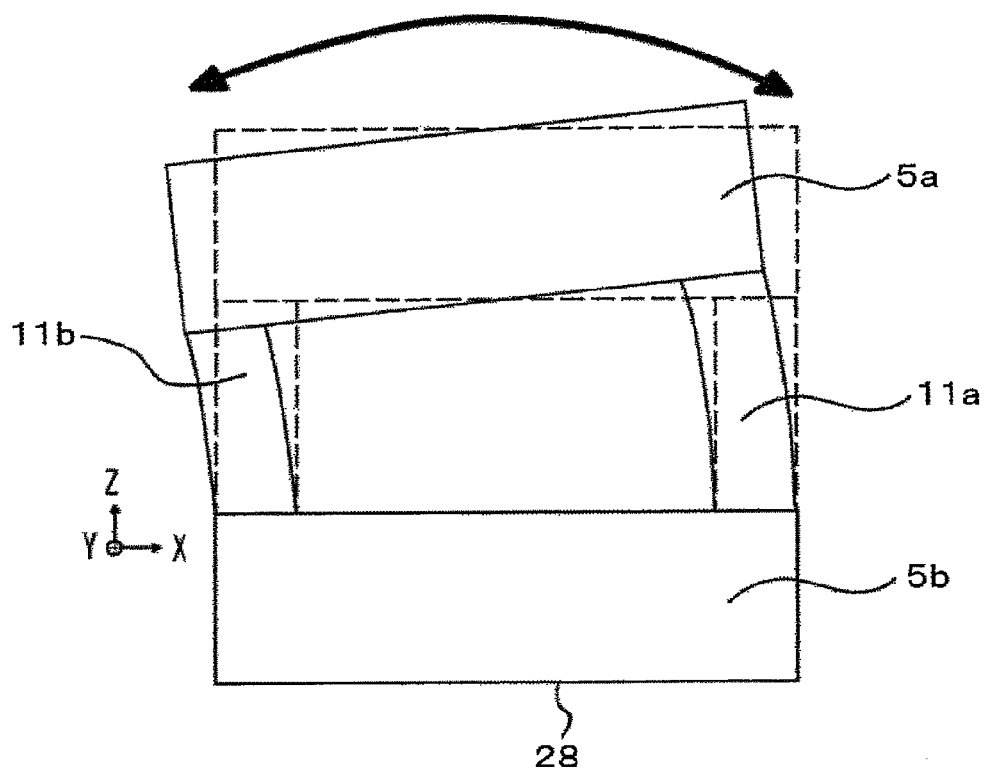
FIG. 4A is a view exaggeratedly depicting the apparatus that undergoes a first bending vibration along an X axis.
Figure 4B:
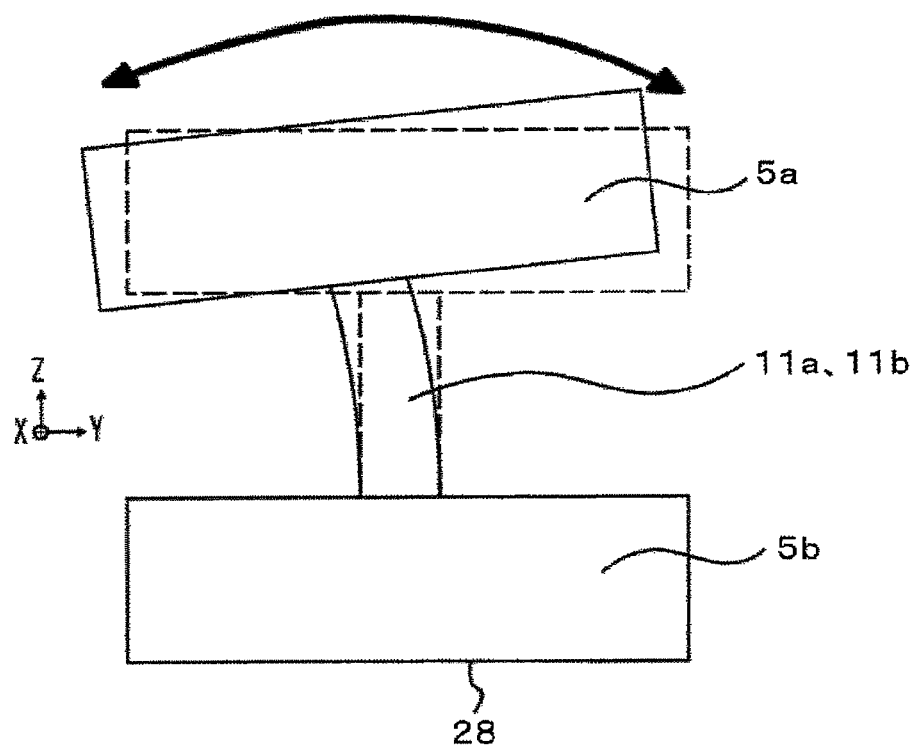
FIG. 4B is a view exaggeratedly depicting the apparatus that undergoes a vibration of a first bending mode along a Y axis.

FIGS. 4A and 4B show an exaggerated manner of the first bending mode vibration. As can be seen from this figure, the lower vacuum container 5b restricted by a floor serves as a node of the vibration, so that the lower vacuum container 5b does not vibrate powerfully. Therefore, it can be found that the vibration of the first bending mode is not transferred to the cooling container 4b or the superconductive coil 2b, efficiently. Thus, the structure where the cooling container module is supported by the lower vacuum container 5b through the vertical support members 21 is effective to damp the vibration of the first bending mode.

In addition, the above structure is effective to not only the vibration of the first bending mode, but the rocking and rocking like vibrations. This detailed description will be given below.

Referring back to FIG. 1, the lateral support members 22 extend from a base 24 on the center of the bottom plate 23 of the lower vacuum container 5b. In addition, the lateral support members 22 support the lower cooling container 4b laterally, taking the base 24 as a fulcrum.

The vertical support members 21 bear various loads, such as the weights of the superconductive coils 2a and 2b, the cooling containers 4a and 4b and accessories thereof, and thermal and mechanical shocks. Accordingly, the vertical support members 21 are required to resist such loads. Meanwhile, the lateral support members 22 do not bear the weight of the superconductive coils 2a and 2b, but it undergoes loads of thermal and mechanical shocks. Hence, the lateral support members 22 need to have a sufficient strength to resist such loads.

With reference to FIG. 1, a description will be given, of a structure of the installed MRI apparatus S. Typically, the MRI apparatus S is installed, while support legs 25 are placed between an apparatus bottom surface 28 and a floor F. Each support leg 25 is formed by stacking a first member 26 on a second member 27, and it can be elastically deformed in the direction in which a load is applied, that is, in the vertical direction. In order for the support leg 25 to be elastically deformed, both members 26 and 27 need to be made of an elastic body. Alternatively, one of the members maybe an elastic body, and the other may be a non-elastic body. If one of the members 26 and 27 is a non-elastic body, then the non-elastic body preferably serves as a spacer. If both of the members 26 and 27 are made of an elastic body, then their spring constants are preferably different from each other. Specifically, one of the members has a low spring constant so as to be fully deformed, while bearing the weight of the MRI apparatus S. Meanwhile, the other has a high spring constant so as to be slightly deformed while bearing the weight. Alternatively; if both are made of an elastic member, then they have a medium spring constant, so that both are fully deformed while bearing the weight. However, the present invention is not limited to this configuration.

Such an elastic body may be a coil spring, conical spring or rubber plate, and such a non-elastic body may be a stainless plate. Furthermore, all the support legs 25 must be a non-magnetic body. Hence, the first and second members 26 and 27 are required to be non-magnetic bodies.

Figure 3B:
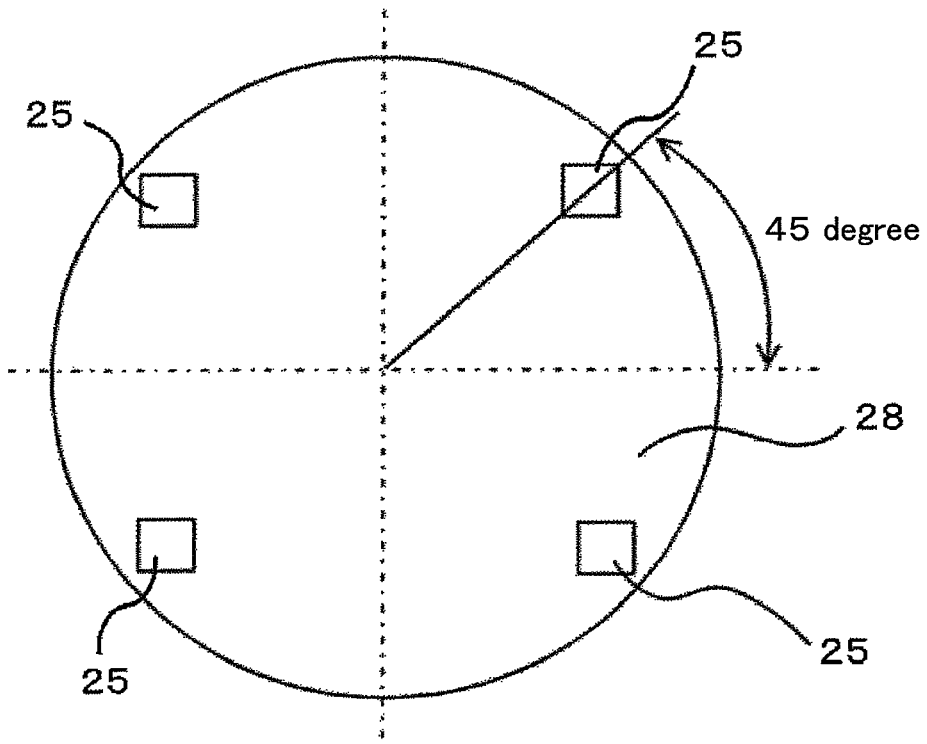
FIG. 3B is a view depicting an arrangement of support legs in the apparatus according to the first embodiment.

The support legs 25 are placed at predetermined locations, respectively, and they make a specific arrangement. In this embodiment, the four support legs 25 are arranged on the circumference of the lower vacuum container 5b and at a 45° angle with respect to the X axis, as shown in FIG. 3B. They correspond to the vertical support members 21.

With the above structure, the rocking vibration occurring on the MRI apparatus S can be efficiently damped. Thus, this structure successfully damps the rocking vibration of the superconductive coils 2a and 2b to the extent that the coils do not affect magnetic resonance images. This detailed description will be given.

Note that the above-described structure depends on the elastic property of the support legs 25 and the arrangement (the number or position) of the support legs 25. First, a description will be given, of the elastic deformation of the support legs 25. Owing to the rocking vibration, the whole apparatus, mostly the vacuum container module or the cooling container module rocks, taking the apparatus bottom surface 28 as a fulcrum, as described above.

Figure 5A:
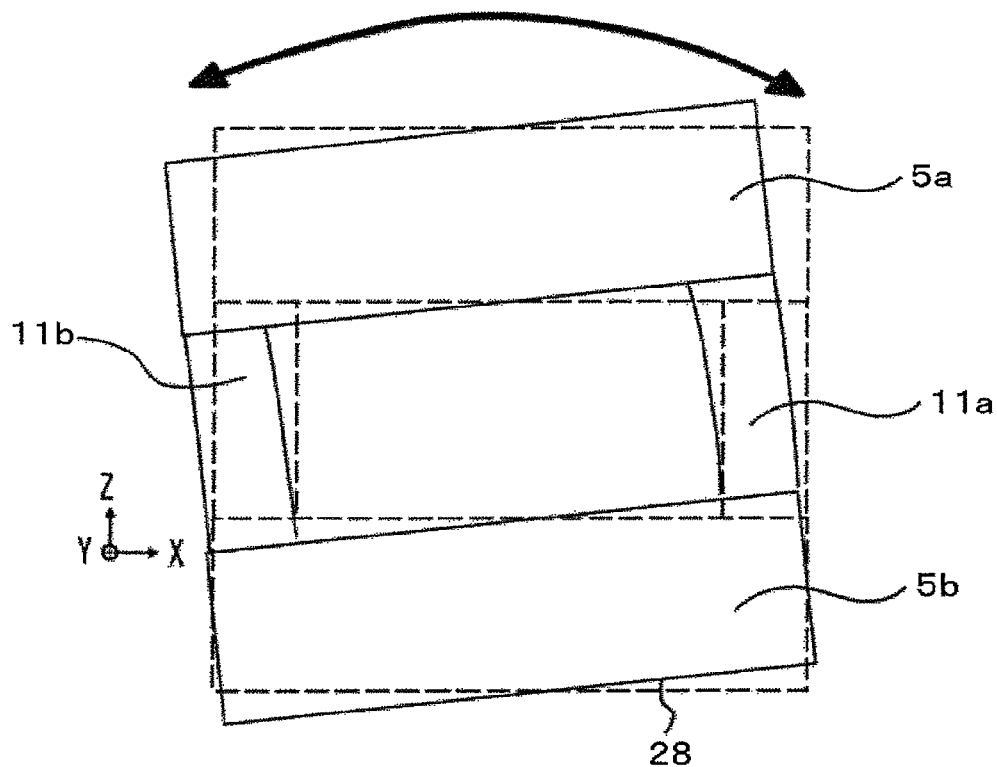
FIG. 5A is a view exaggeratedly depicting the apparatus that undergoes the vibration of the first bending mode along an X axis.
Figure 5B:
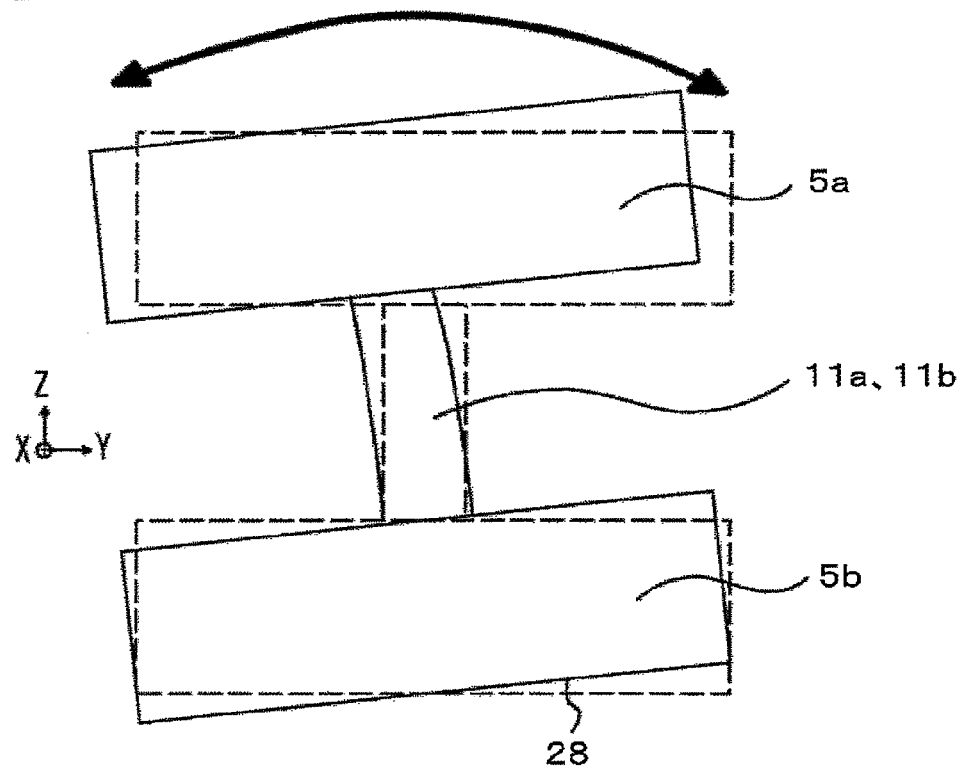
FIG. 5B is a view exaggeratedly depicting the apparatus that undergoes the rocking vibration along a Y axis.

FIGS. 5A and 5B shown an exaggerated manner of the rocking vibration. The rocking vibration is likely to occur in the case where the apparatus bottom surface 28 of the apparatus S is partially supported by a floor F and the apparatus is therefore unstable.

Generally, the MRI apparatus S is installed in a shield room in order not to have the magnetic field permeated from the static magnetic field generator to the outside of the photographic room, or not to have an external disturbance magnetic field permeated into the photographic room. The floor of a typical shield room has a defined flatness of about 2 mm to 5 mm. Thus, the floor of a shield room is allowed to have a certain level of projections or depressions. However, the apparatus bottom surface 28 of the MRI apparatus S is typically less flat. This is because the lower vacuum container 5b is deformed by thermal shocks upon welding. As a result, the bottom plate 23 of the lower vacuum container 5b has an arched shape. In this case, if the MRI apparatus S is placed directly on the floor of a shield room, then the apparatus bottom surface 28 comes in partial contact with the floor F. This may cause the MRI apparatus to be unstable, so that the rocking vibration is likely to occur. Especially when the contact portion is small and close to the central axis of the MRI apparatus S, the rotational moment around the X or Y axis is made small. Therefore, the vacuum container module is likely to cause the large rocking vibration.

However, with the support legs 25, the MRI apparatus S can be stabilized, so that the rocking vibration of the apparatus S, that is, of the vacuum container module is efficiently damped. Specifically, the MRI apparatus S is installed on the floor F through the multiple support legs 25. Note that the number of the support legs 25 is four in this embodiment. The support legs 25 can be deformed in the same direction as the weight of the MRI apparatus S is applied. Thanks to this deformation, the MRI apparatus S is supported uniformly by the support legs 25. This makes it possible to enhance the stability of the MRI apparatus S, thereby damping the rocking vibration efficiently.

If the first and second members 26 and 27 of the support leg 25 are made of elastic bodies, it is preferable that the first member 26 has a low spring constant and the second member 27 has a high spring constant. Consequently, the stability of the apparatus S is enhanced in the following manner. Once the MRI apparatus S is supported by the support legs 25 on the floor F, the first member 26 is fully deformed and loses its elastic member. This full deformation absorbs the point contact between the apparatus bottom surface 28 and the floor F. Even if the first member 26 cannot absorb the uneven contact completely, the second member 27 absorbs the point contact. Consequently, it is possible to support the MRI apparatus S by means of a uniform supporting force, and to keep the MRI apparatus S stably installed.

The flatness of the floor F of a typical shield room is up to 5 mm. A floor having a flatness of about 1 mm can be formed at less considerable costs. In consideration of this flatness level, it is preferable that the first member 26 having a low spring constant is deformed by 1 mm to 2 mm. In addition, the support leg 25 may be deformed non-linearly. In this case, the first member 26 is made of a rubber plate, and has projections on its surface where a load is applied.

Next, a description will be given, of an effect of an arrangement of the support legs 25. Factors in the arrangement of the support legs 25 include the number of the support legs 25 and the position thereof.

First, a description is given, of the number of the legs 25. Generally, the rocking vibration decreases in a magnitude, as its vibration frequency is higher. Moreover, the magnitude of the rocking vibration becomes larger, when its vibration frequency is identical to the natural vibration frequency of the MRI apparatus S, that is, of the vacuum container module or the cooling container module. In consideration of the above property, what is important is how to make the frequency of the rocking vibration higher and how to change it to any vibration frequency other than the natural vibration frequency of the MRI apparatus S. The frequency of the rocking vibration depends on the rotational moment of the apparatus S (around the X or Y axis). The rotational moment is defined by the supporting force of the support legs 25 and a distance between the support legs 25 and the center of gravity of the apparatus S. The supporting force of the support legs 25 is determined by the spring constant of the legs 25 and the number thereof. The distance between the support leg 25 and the center of gravity of the apparatus S is equivalent to a distance between the support leg 25 and a vertical line passing through the center of gravity of the apparatus. In consideration of this relationship, in order to increase the frequency of the rocking vibration, the spring constant of support legs 25 is made high and the distance extends. Alternatively, the number of support legs 25 may increase.

Even three support legs 25 can sufficiently support the MRI apparatus S. However, the three support legs 25 cannot optimize the frequency of the rocking vibration. This is because the three support legs do not make a symmetry arrangement with reference to the X or Y axis. In this case, the frequency of the rocking vibration can be optimized in the first direction (e.g. on the X axis), but cannot be done in the second direction (e.g. on the Y axis). Therefore, in order to optimize the frequency, the arrangement of the support legs 25 needs to be symmetry. In other words, the number of the legs 25 must be more than three.

However, as the number of support legs 25 increases, the structure using the support legs 25 becomes more unstable. This is because if the number of support legs 25 is large, one or some of the support legs 25 may not be in contact with the apparatus bottom surface 28 firmly, or the apparatus bottom surface 28 may be off from one or some of the support legs 25. This results in the deterioration of stability of the apparatus S. Likewise, as the spring constant of the support legs 25 is set higher, the apparatus bottom surface 28 is more likely to be off from the legs. The spring constant of the support leg 25 needs to be set on the condition that this floating is taken into account. In terms of this floating, the number of the support leg 25 is preferably small. In conclusion, the preferable number of the support legs 25 is determined to be four. Hence, the four legs are employed in this embodiment.

Figure 6:
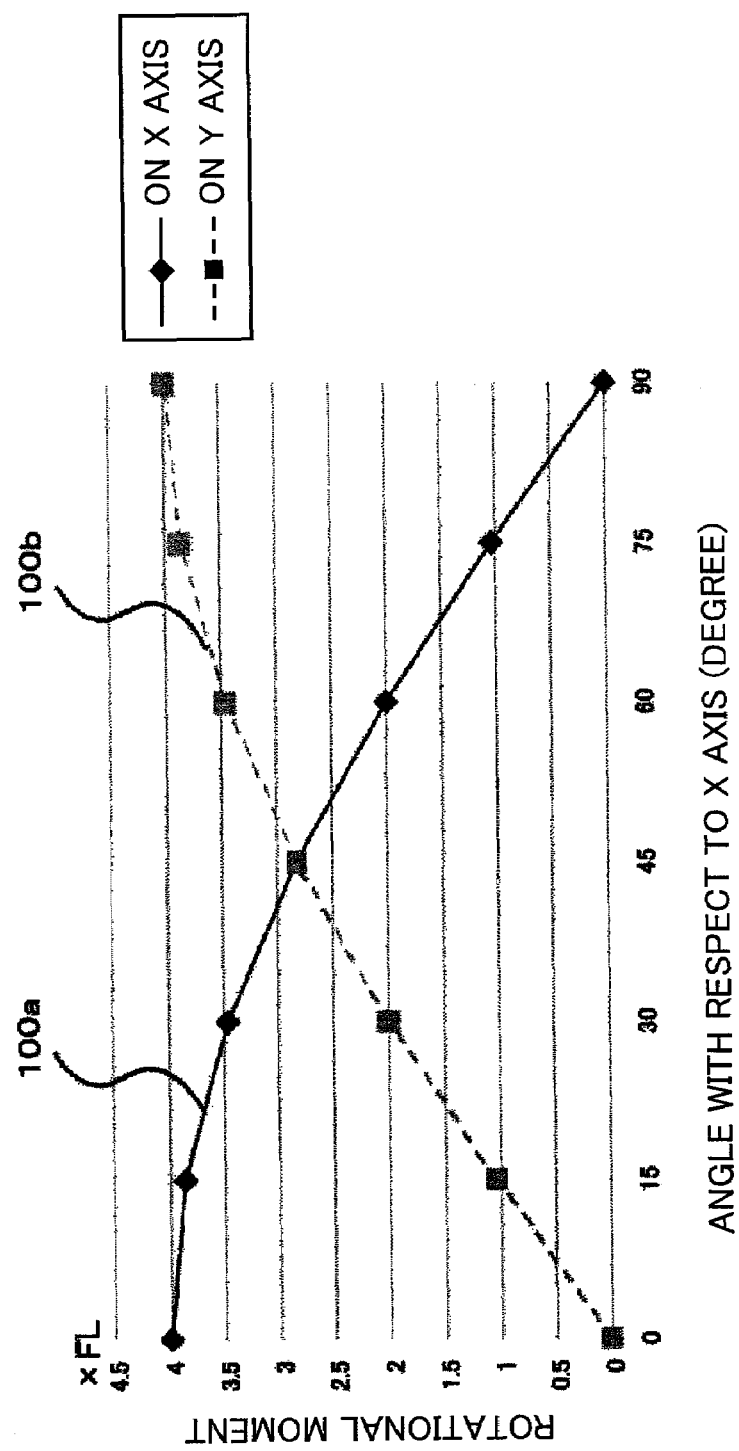
FIG. 6 is a view showing a relationship between the arrangement of the support leg and a rotational moment of the apparatus.

Second, a description is given, of the position of the support legs 25. FIG. 6 shows a graph indicating a relationship between the position of the support leg 25 and the rotational moment of the apparatus on the X and Y axes. The vertical axis represents a rotational moment, and the horizontal axis represents an angle of the support leg 25 with respect to the X axis. Furthermore, a line 100*a* indicates a rotational moment on the X axis, and a line 100*b* indicates a rotational moment on the Y axis. This graph introduces the following result.

It is assumed that two of the four legs are placed on the X axis and the other two legs are placed on the Y axis. In this case, the rotational moment on the X axis depends only on the two support legs on the X axis, and the rotational moment on the Y axes depends only on the two support legs on the Y axis. Thus, the following relationship is obtained:

$$M = F \cdot L + F \cdot L = 2 \cdot F \cdot L,$$

where "M" is a rotational moment on X or Y axis, "F" is the spring constant of the support leg 25, and "L" is a distance between the support leg 25 and the center of gravity of the apparatus S.

In contrast, in the case where the support legs 25 deviate from the X and Y axes, then the rotational moment on each of the X and Y axes depends on all of the four support legs 25. In this case, the following relationship is established:

$$M = F \cdot a_1 L + F \cdot a_2 L + F \cdot a_3 L + F \cdot a_4 L$$

where "$a_1$" to "$a_4$" are constants determined depending on an angle at which the support leg 25 forms with the X axis.

As can be seen from the graph of FIG. 6, when each of the support legs 25 is positioned at a 45° angle with respect to the X axis, the following relationship is given:

$$a1 = a2 = a3 = a4 = \frac{1}{2}^{1/2},$$

$$M = 4 \cdot F \cdot L/2^{1/2} \approx 2.83 \cdot F \cdot L.$$

Thus, the rotational moment M on the X axis has a max value, and the rotational moment M on the Y axis also has a max value.

In consideration of this result, in order to maximize the rotational moments on the X and Y axes, each support leg 25 needs to be positioned at a 45° angle with respect to the X axis.

Up to this point, how to damp the rocking vibration of the vacuum container module has been described.

Now, how to damp the vibration of the cooling container module will be described. The cooling container module is affected by the rocking-like vibration, which is similar to the rocking vibration. The rocking-like vibration occurs on the cooling container module supported by the lower vacuum container 5*b* through the vertical support members 21, and it is typically smaller than the rocking vibration occurring on the vacuum container module. It is preferable that the structure also enables the effective damping of the rocking-like vibration. In fact, the above-described arrangement of the vertical support members 21 successfully damps the rocking-like vibration. This arrangement is constituted by the four vertical support members 21 positioned at a substantially 45° angle with respect to the X axis. The reason why the rocking-like vibration is efficiently damped is as follows.

The rocking-like vibration of the cooling container module is caused by the rotational moment, as in the case of the rocking vibration of the vacuum container module. One factor to determine the rotational moment of the cooling container module is the number of vertical support members 21. Specifically, as the number of the vertical support members 21 increases, the rotational moment is made greater. However, if many vertical support members 21 are used, heat amount transferring from the vacuum container 5 to the cooling container 4 is prone to increase. In order to sufficiently block the thermal transfer therebetween, it is preferable that the number of vertical support members 21 is small. Therefore, the four vertical support members 21 are used in this embodiment.

The rotational moment of the cooling container module depends on the arrangement of the vertical support members 21, as in the case of the vacuum container module. As to the arrangement, it is preferable that the four vertical support members 21 are arranged at a 45° angle with respect to the X axis, because of the same reason as the support legs 25.

In addition to the angle of the vertical support members 21, a distance between each member 21 and the center of gravity of the apparatus S need to be considered. The distance therebetween is related to the rotational moment of the member 21. In addition, the distance is related to a transfer rate at which the rocking vibration of the vacuum container module transfers to the cooling container module through the vertical support members 21.

In order to increase the rotational moment, the distance between the member 21 and the center of gravity of the apparatus S needs to be long. On the other hand, in order to decrease the transfer rate, the vertical support member 21 is placed where the magnitude of vibration is low, that is, at a location close to the center of the vacuum container module.

In consideration of the above trade-off relationship, the position of the vertical support member 21 needs to be determined. Typically, the increase in the rotational moment has higher priority. Accordingly, the increase in the rotational moment comes first in this embodiment.

In this embodiment, the vertical support members 21 are aligned with the support legs 25. Owing to this arrangement, the load acting on the cooling container module is transferred to the support legs 25 through the vertical support members 21 directly. This makes it possible to release the weight of the cooling container module from the lower vacuum container 5b, thereby enhancing the stability of the apparatus.

Next, a description will be given below, of an MRI apparatus according to second to fourth embodiments of the present invention. An MRI apparatus according to second to fourth embodiments of the present invention has a structure similar to that of the MRI apparatus S of the first embodiment. However, the arrangements of the vertical support members 21 and the support legs 25 are different.

Figure 7A:
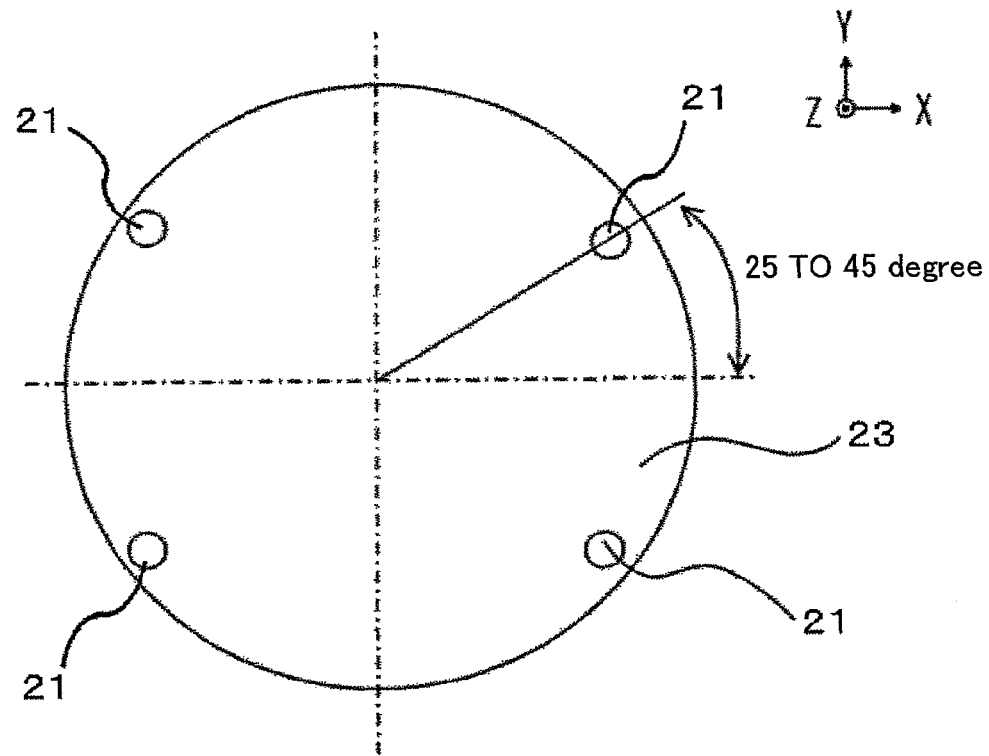
FIG. 7A is a view depicting an arrangement of vertical support members in an apparatus according to a second embodiment of the present invention.
Figure 7B:
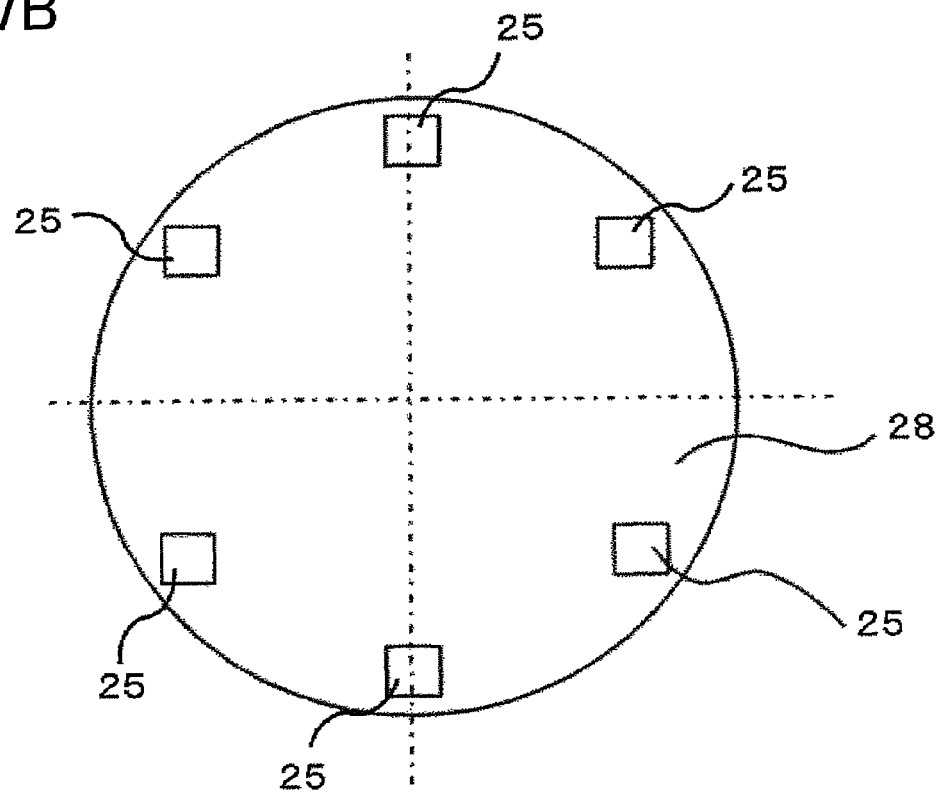
FIG. 7B is a view depicting an arrangement of support legs in the apparatus according to the second embodiment.

In the second embodiment, the MRI apparatus includes vertical support members 21 and support legs 25 that all have an asymmetric structure. If the MRI apparatus employs an asymmetric structure, then the rocking vibration is inclined to increase on the Y axis. In consideration of this property, each vertical support member 21 is not positioned at a 45° angle with respect to the X axis. Concretely, each vertical support member is shifted from the middle between the X and Y axes toward X axis by some degree. This makes it possible to decrease the transfer rate at which the rocking vibration transfers from the vacuum container module to the cooling container module. Thus, it is preferable that each vertical support member 21 is positioned at a 25° to 45° angle with respect to the X axis. In this embodiment, each of the four vertical support members 21 is positioned at a 25° to 45° angle with respect to the X axis, as shown in FIG. 7A. Referring to FIG. 7B, the support legs 25 are arranged corresponding to the vertical support members 21. However, if the support leg 25 is shifted toward the X axis, then the rotational moment on the Y axis is prone to be small. In order to overcome this disadvantage, two additional support legs 25 may be positioned on the Y axis.

Figure 8:
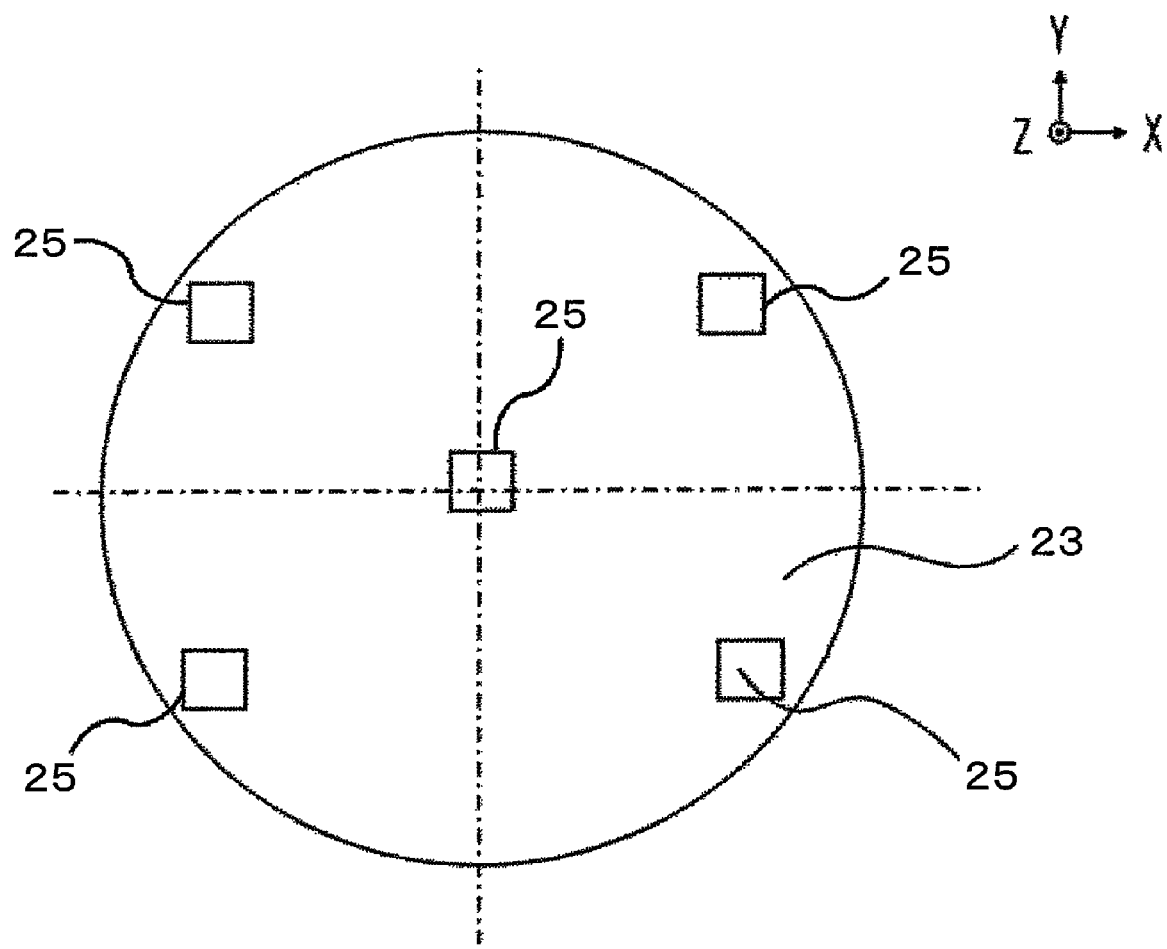
FIG. 8 is a view depicting an arrangement of support legs in an apparatus according to a third embodiment of the present invention.
Figure 9A:
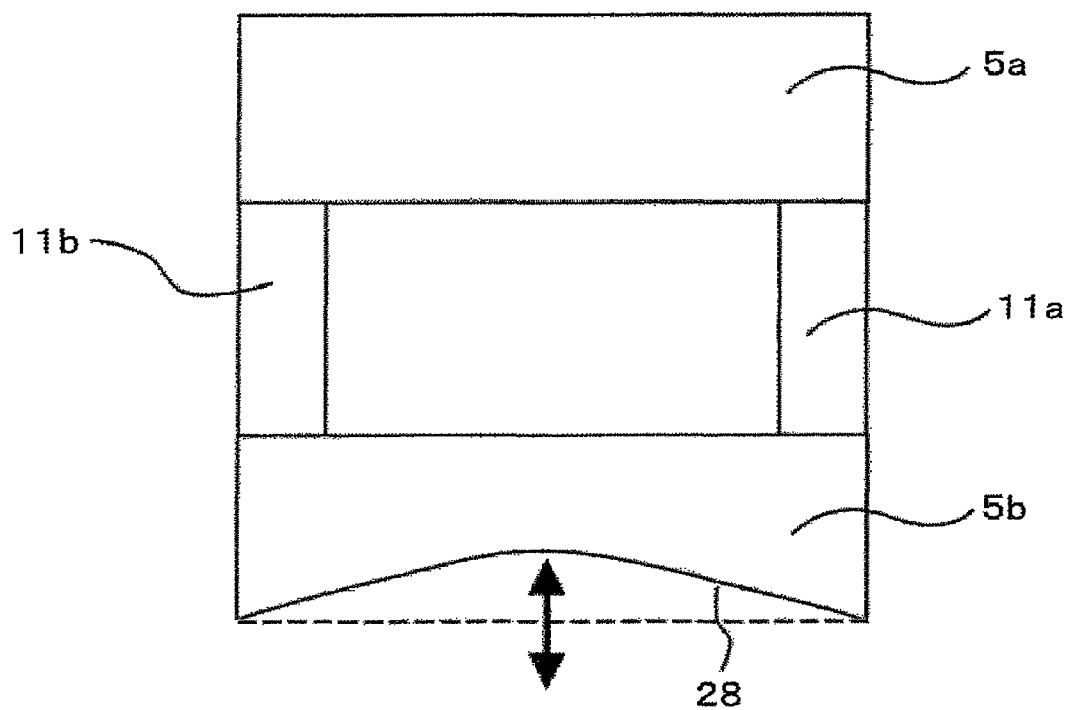
FIG. 9A is a view exaggeratedly depicting the apparatus, of which apparatus bottom surface undergoes a vibration.
Figure 9B:
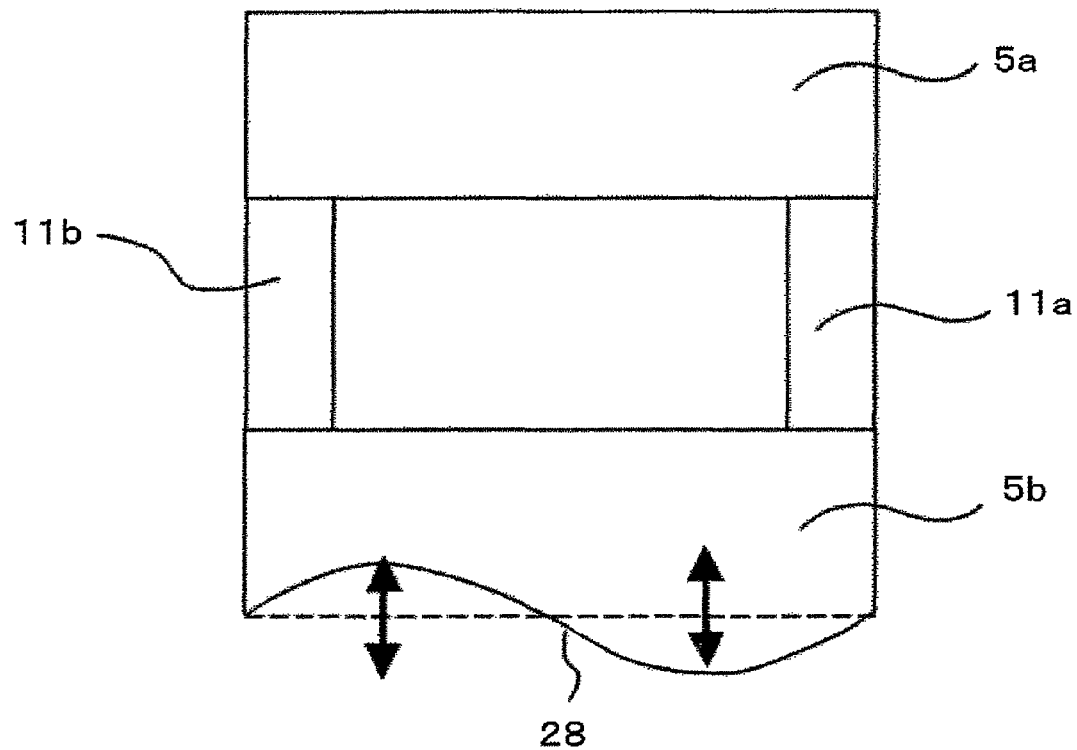
FIG. 9B is a view exaggeratedly depicting the apparatus, of which apparatus bottom surface undergoes a vibration.

An apparatus according to a third embodiment of the present invention includes the support legs 25 arranged as shown in FIG. 8. To demonstrate, the five support legs 25 are used. Four of them are arranged in the same fashion as those of the second embodiment, and the remaining one is placed at the center of the vacuum container module (i.e. on the origin). The support leg 25 on the center has a function of damping the vibration of the apparatus bottom surface 28 efficiently. The vibration of the apparatus bottom surface 28 is a vibration of bending modes. It is caused due to the apparatus bottom surface 28 which is partially off from the floor F. FIG. 9 shows an exaggerated manner of the vibration of the apparatus bottom surface 28. The apparatus bottom surface 28 of the apparatus S vibrates in the zeroth bending mode (see FIG. 9A) or first bending mode (see FIG. 9B). Such vibrations can be efficiently damped by supporting a portion where the loop of the vibration appears. The arrangement of this embodiment is configured to damp the vibration of zeroth bending mode. Hence, the support leg 25 supports the center of the apparatus bottom surface 28, where the loop of the vibration appears.

Figure 10:
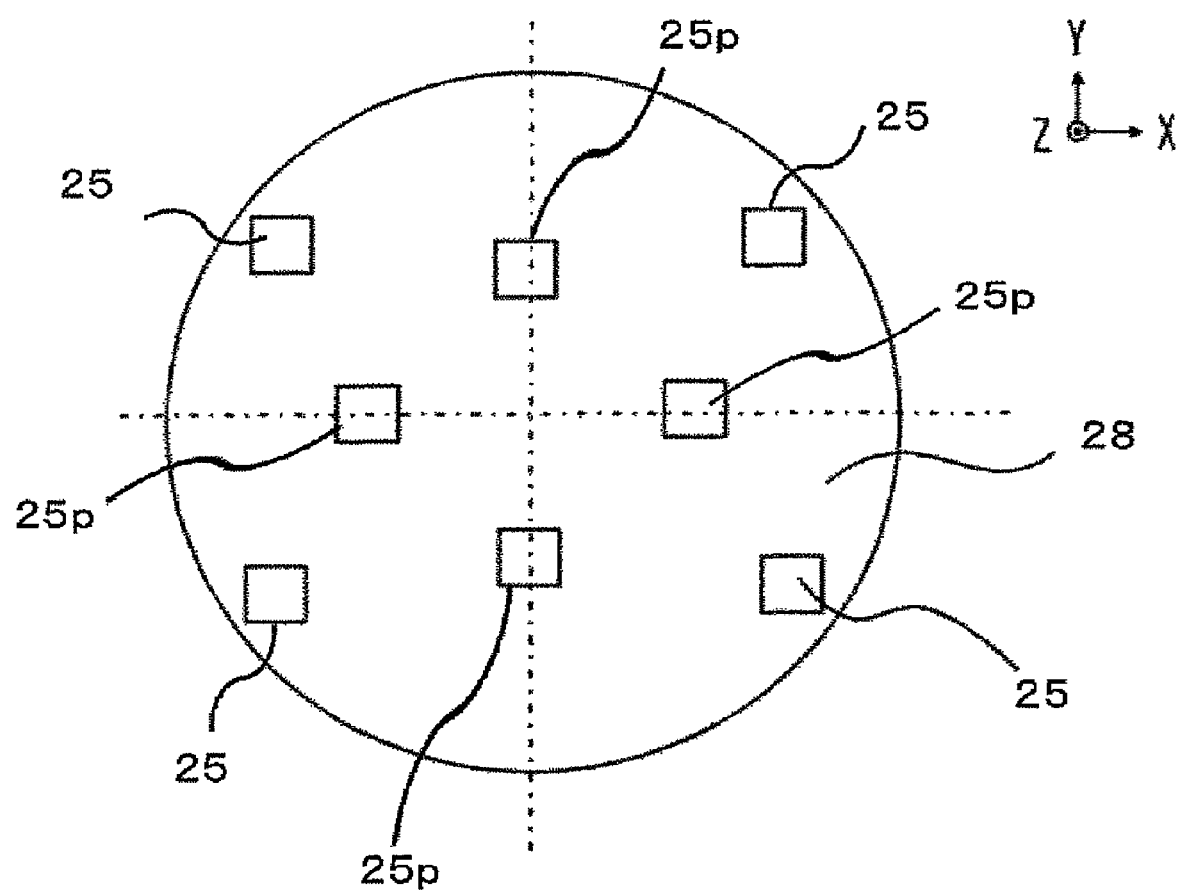
FIG. 10 is a view depicting an arrangement of support legs in an apparatus according to a fourth embodiment of the present invention.

In a fourth embodiment of the present invention, the support legs are arranged as shown in FIG. 10. To demonstrate, the eight support legs are used. Four of them are arranged in the same fashion as those of the second embodiment. Two of the remaining four support legs 25p are arranged on the X axis, and the other two are arranged on the Y axis. Furthermore, each of the support legs 25p is positioned at the middle of the distance between each support leg 25 and the center of gravity. This structure is configured to damp the vibration of the first bending mode on the apparatus bottom surface 28. Hence, the four support legs 25a are positioned where the loop of the vibration appears.

Up to this point, the MRI apparatus S according the embodiments of the present invention has been described. This MRI apparatus has the simple structure enabling the efficient damping of the vibrations which may cause the deterioration of magnetic resonance images. In addition, this apparatus can be applied to a wide variety of technical fields.

From the aforementioned explanation, those skilled in the art ascertain the essential characteristics of the present invention and can make the various modifications and variations to the present invention to adapt it to various usages and conditions without departing from the spirit and scope of the claims.

What is claimed is:

1. A magnetic resonance imaging (MRI) apparatus comprising:
    a static magnetic field generator having two pieces which are placed opposite each other vertically across an image pickup space, and a connection pipe connecting the two pieces; and a plurality of support legs for supporting a weight of said MRI apparatus, the support legs deforming elastically in a direction in which the weight is applied according to a spring constant and each of the support legs being arranged at predetermined positions between an apparatus bottom surface and a floor upon which the MRI apparatus is installed, wherein each of the support legs has a spring constant which is set to absorb a distance substantially equal to a relative displacement between the bottom surface of the MRI apparatus and the floor, while bearing the weight.

2. The magnetic resonance imaging apparatus according to claim 1, wherein each of the support legs comprises a stack of a first member and a second member, and the first and second members have different spring constants.

3. The magnetic resonance imaging apparatus according to claim 1, wherein the support legs include more than four support legs.

4. The magnetic resonance imaging apparatus according to claim 3, further comprising a support mechanism for supporting the static magnetic field generator, the support mechanism having different strengths in first and second horizontal directions perpendicular to each other, wherein a strength of the first horizontal direction is higher than the strength of the second horizontal direction, wherein each of four of the support legs out of more than four support legs is placed at 25° to 45° angle with respect to the first horizontal direction.

5. The magnetic resonance imaging apparatus according to claim 3, further comprising:

a plurality of superconductive coils constituting the static magnetic field generator;

a cooling container module including a plurality of cooling containers for containing the superconductive coils, respectively;

a vacuum container module including a plurality of vacuum containers for containing the cooling containers, respectively; the cooling container module being erected on a bottom of the vacuum container module; and a plurality of support members which are arranged at predetermined positions for supporting the cooling container module.

6. The magnetic resonance imaging apparatus according to claim 5, further comprising a support mechanism for supporting the static magnetic field generator, the support mechanism having different strengths in first and second horizontal directions perpendicular to each other, wherein a strength of the first horizontal direction is higher than the strength of the second horizontal direction, wherein the support members include four support members, and each of the support members is placed at 25° to 45° angle with respect to the first horizontal direction.

7. The magnetic resonance imaging apparatus according to claim 6, wherein arrangement positions of the four support members are identical to arrangement positions of the four support legs out of the more than four support legs.

* * * * *